United States Patent [19]
Esquibel

[11] Patent Number: 5,885,402
[45] Date of Patent: Mar. 23, 1999

[54] DIAGNOSTIC HEAD ASSEMBLY FOR PLASMA CHAMBER

[75] Inventor: James Esquibel, Rio Rancho, N. Mex.

[73] Assignee: Applied Materials, Santa Clara, Calif.

[21] Appl. No.: 683,501

[22] Filed: Jul. 17, 1996

[51] Int. Cl.$^6$ ................................................. H01L 21/00
[52] U.S. Cl. .......................................................... 156/345
[58] Field of Search ............................. 156/345, 345 MT

[56] References Cited

U.S. PATENT DOCUMENTS

| | | | |
|---|---|---|---|
| 4,376,672 | 3/1983 | Wang et al. | 156/345 |
| 5,117,192 | 5/1992 | Hurd | 324/727 |
| 5,282,925 | 2/1994 | Jeng et al. | 156/345 |
| 5,339,039 | 8/1994 | Carlile et al. | 315/111.21 |

Primary Examiner—Richard Bueker
Attorney, Agent, or Firm—Todd Patterson

[57] ABSTRACT

The present invention generally provides a diagnostic head assembly which preferably includes both optical and non-optical diagnostic devices which locates the diagnostic devices in proximity to the processing region of a plasma reactor to enable in situ process control. Such diagnostic head assembly may include a quartz crystal microbalance, an optical endpoint detector and a Langmuir probe. The invention also provides microprocessor control of a plasma process using the information gathered from the optical and non-optical diagnostic devices. The invention further provides a plasma reactor that includes both optical and non-optical diagnostic devices positionable in a single diagnostic port provided in a sidewall of the reactor.

15 Claims, 4 Drawing Sheets

DIAGNOSTIC HEAD ASSEMBLY FOR PLASMA CHAMBER

BACKGROUND OF THE INVENTION

1. Field of the Invention

The present invention relates to the field of semiconductor processing. More particularly, the invention relates to a plasma chamber having a diagnostic head assembly for detecting the completion of a plasma etch process, monitoring the plasma characteristics in a plasma reaction and determining the build up of material on the chamber walls using both optical and/or non-optical techniques.

2. Background of the Related Art

Sub-half micron feature size and multilevel integration are two of the key technologies for the next generations of very large scale integration ("VLSI") and ultra large scale integration ("ULSI"). Plasma processing and plasma-assisted processing are essential to the production of present and future generations of large scale integrated circuits. The advantages of plasma processing are being applied to thin-film processes that involve a deposition or removal of metals, semiconductors, inorganic insulators, and organic films. Increased production rates, more precise production control and the unique material properties that can result from the non-thermal chemistry of plasma processing are significant compared to conventional processing techniques. Because of the complexity of the physical and chemical environment in a process plasma, a large array of process monitors, historically termed "plasma diagnostics" are required to characterize the plasma, or to properly monitor important control parameters. The multilevel interconnections that lie at the heart of this technology require very precise processing to fabricate high quality, uniform gates, metal wires, plugs and other features. The uniformity and performance of these features is effected by numerous factors, including the methods and apparatus used to control plasma process conditions.

As the density of semiconductor devices increases, plasma etch processes are increasingly utilized because such processes can be employed to etch films in situ and avoid wet etch techniques. A typical plasma etch system includes a plasma processing chamber and a workpiece holder to support the workpiece in the chamber. Inlet ports introduce a reactant gas or gases into the chamber where electrodes are used to excite the gases into a plasma state in the chamber. One or more of the electrodes may be excited by a direct current (DC) voltage source or a radio frequency (RF) voltage source, often at frequencies ranging between about 2 $MH_z$ and about 13.56 $MH_z$ to couple energy from the power supply into the plasma. Typical methods for transferring the power into the gas include direct coupling, capacitive coupling, and inductive coupling. Often, coupling consists of a combination of these methods, even when it is not intentional. In addition, inductors (or coil arrangements) can be used in a chamber arrangement to inductively couple power into the process chamber to excite gases introduced in the chamber into a plasma state.

Plasma etch processes can be used to etch metals, semiconductors, inorganic insulators and organic films using reactive gases. Typical reactive gases include fluorine-containing gases, such as $NF_3$, $SF_6$, $CHF_3$, $CF_4$ or $C_2F_6$, sometimes in combination with $O_2$, Ar, $N_2$, or He. These gases are useful in obtaining desired etch rates, selectivities and uniformities, all of which must be precisely controlled.

A typical process for etching a contact via is described in Arleo et al, U.S. Pat. No. 5,176,790, which discusses etching a dielectric in a plasma using a mixture of fluorine-containing gases and nitrogen-containing gases. Dry etching of metals, such as aluminum, can be performed either by reactive ion etching (RIE) or by plasma etching in the presence of a halide gas, such as chlorine or bromine-containing gases for aluminum etching and fluorine-containing gases for tungsten etching. In addition, dry etching of a laminated film consisting of a metal silicide layer and a polycrystalline silicon layer can be performed using a mixed gas of $SF_6$ and $O_2$. Other gas combinations such as HBr, $Cl_2$ and $O_2$; $NF_3$, $Cl_2$ and $O_2$; $Cl_2$ and $O_2$; as well as other gases can also be used to perform dry etching processes.

The increased demands placed on dry plasma etching make it extremely important to achieve reproducibility of etch results from wafer-to-wafer and batch-to-batch. In addition, the required feature characteristics need to be achieved at high wafer throughput requiring higher etch rates while achieving precise selectivity and uniformity across the wafer surface. Finally, the etching process and accompanying plasma chemistry should have a minimum effect on the etching system and the maintenance of that system.

In order to obtain a substantially uniform etch across the substrate surface, it is necessary to create and maintain a uniform plasma over the substrate and to monitor changes in the plasma. Typically, optical sensors are located within a single port on the chamber to detect changes in plasma characteristics. The presence of sensors and probes in the plasma region of the chamber, however, may disturb the plasma uniformity. Consequently, the use of sensors or probes is generally limited to a single sensor positioned in a small defined area along the perimeter of the chamber.

In applications where it is most important to determine a plasma's internal discharge parameters, an electrostatic probe, such as a Langmuir probe, may be used to measure the plasma density, charged particle concentration, and energy distribution functions. The Langmuir probe is typically a metallic electrode of cylindrical, planar, or spherical geometry, which collects current from a plasma when a voltage is applied to the probe. The probe's current collection properties, often called the probes's "current-voltage (I-V) characteristic" or the "probe characteristic", yields information on the plasma's internal discharge parameters. The probe's current-voltage characteristic is very useful for studying plasma parameters in a wide variety of situations. Langmuir probes suitable for use in RF plasmas are described by Carlile in U.S. Pat. No. 5,339,039, entitled "Langruir Probe System For Radio Frequency Excited Plasma Processing System," which is incorporated herein by reference.

In other applications where it is most important to closely monitor the etch rate of thin films on a substrate and material build up on the chamber walls, it can be beneficial to use a quartz crystal microbalance (QCM) to monitor the amount of material etched from the substrate and deposited on the chamber walls. Piezoelectric quartz crystals are commonly used to monitor the quantity of film material deposited on the crystal. These basic techniques are described in U.S. Pat. Nos. 4,817,430, 4,207,836, and 4,311,725, which are incorporated herein by reference. A circuit for monitoring a piezoelectric crystal for changes in its resonant frequency as a film is deposited on the crystal is described in U.S. Pat. No. 5,117,192, which is incorporated herein by reference. One such QCM which can be used to advantage with the present invention is the XTM/2 Deposition Monitor available from Leybold Inficon Inc. of East Syracuse, N.Y. However, other QCM's are available from other vendors and may be used to advantage in accordance with the present invention.

In plasma etch processes where it is most important to know when an etch process is complete, an endpoint detector is typically used to sense changes in the gas composition within the chamber. One such endpoint detection device is available from Applied Materials, Inc., Santa Clara, Calif., and is known as the Endpoint Optical Emission System. This system allows the user to define the etch endpoint algorithms for each etch chamber, store the endpoint data for each etched wafer and to play back the endpoint trace. The Endpoint Optical Emission System uses spectral emissions of the plasma to sense endpoint.

However, despite the availability of these instruments to monitor and control individual aspects of plasma processing, there remains a need to increase the degree of control over the entire plasma process and plasma chamber and to precisely determine the intervals between which clean processes must be performed in the chamber. In particular, there is a need for an apparatus that will provide improved monitoring and control over plasma processes, particularly plasma etch processes. It would be desirable if the apparatus could indicate the etch rate, accurately determine the endpoint of the etch process and monitor material build up on the chamber walls. Furthermore, it would be desirable if the apparatus could use the existing detection port found in typical plasma chambers and maintain the uniform plasma characteristics within the chamber. It would also be desirable if the apparatus could improve reproducibility of process results from wafer-to-wafer, batch-to-batch, achieve greater wafer throughput, have a minimum effect on the plasma processes and have a minimum effect on the maintenance of that system.

SUMMARY OF THE INVENTION

The present invention provides a diagnostic head assembly including both optical and non-optical devices for monitoring a plasma process in a chamber, wherein the head assembly is positionable within a detection port in a wall of a plasma process chamber. The head assembly includes a body member having multiple ports through which diagnostic devices are located and a flange for coupling with a wall of the chamber to maintain a vacuum environment within the chamber. Preferably, the head assembly includes an optical sensor, such as an endpoint detector, disposed behind quartz window to monitor the spectral characteristics of a plasma. The head assembly also preferably includes a recessed area in which a deposition monitor is disposed to monitor material deposition in the area of the recess. The deposition monitor is preferably a quartz crystal microbalance disposed within the recess so that the QCM is disposed adjacent to the interior chamber wall. A port formed through the head assembly enables electrical connection thereto. A separate window clamp may be used to secure the quartz window within the first port and also secure the optical sensor thereto. It is also preferred that the head assembly further comprise a microprocessor controller for receiving electronic signals from the deposition monitor and the optical sensor for controlling the process within the chamber and for determining the need to perform a chamber cleaning process.

In another aspect of the invention, the head assembly further comprises an additional port through which a plasma monitoring probe is disposed. The preferred plasma monitoring probe is a Langmuir probe.

In still another aspect of the invention, a control system is provided for a plasma etch chamber having an enclosure wall, an electrode, a power source coupled to the electrode, a gas supply valve, and a detection port therein. The control system includes a diagnostic head assembly, as described above, having a body member positionable within the detection port and a flange for coupling with the enclosure wall to maintain a vacuum environment in the chamber. Electronic signals from the deposition monitor, optical sensor and optional plasma monitor are communicated to a microprocessor controller which, in turn, provides electronic control signals to the system operator enabling control over the system. The microprocessor of each diagnostic device may also be connected to the system controller so that the system controller can adjust the gas supply valve and the power and bias RF sources to optimize processing or to initiate other processes, such as a periodic cleaning processes. The microprocessor may be programmed to send an electronic signal closing the gas supply valve upon detection of a composition change in the gas phase. Furthermore, the microprocessor may be programmed to send an electronic signal turning off the power supply upon detection of a composition change in the gas phase. It is preferred that the microprocessor compare the electronic signals provided by each diagnostic device to determine the status of the plasma process.

In yet another aspect of the invention, a plasma process chamber is provided. The plasma chamber comprises an enclosure wall having a power source, a gas supply valve coupled to a reactant gas source, and a detection port extending through the enclosure wall. A diagnostic head assembly, as described above, is secured within the detection port to provide a comprehensive diagnostics within the chamber. A microprocessor controller controls the operation of the chamber based on at least the first and second electronic signals, by providing electronic control signals to the gas supply valve and the power sources.

Another aspect of the invention provides a method of controlling a plasma process chamber. The method includes etching a thin film on a substrate in the chamber; measuring the amount of deposits forming on a deposition monitor, wherein the deposition monitor generates an electronic signal indicating the amount of deposits formed; and detecting changes in the gas phase composition within the chamber using an optical sensor, wherein the optical sensor generates an electronic signal indicating the nature of the composition change. The deposition monitor is preferably a quartz crystal microbalance having a quartz crystal, wherein the deposits form on the quartz crystal. The electronic signals are communicated to a microprocessor controller which utilizes both electronic signals to control the chamber conditions. More particularly, the microprocessor controller may utilize the electronic signal indicating the amount of deposits formed on the chamber wall to verify that the electronic signal indicating the composition change represents a valid endpoint of the etch process and/or to determine when a cleaning process should be performed.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

FIGS. 2(a–c) are front, side and back views of a diagnostic head assembly.

FIGS. 3(a–b) are side and back views of a window clamp for use with the head assembly of FIGS. 2(a–c).

DETAILED DESCRIPTION OF A PREFERRED EMBODIMENT

The present invention generally provides a diagnostic head assembly which preferably includes both optical and non-optical diagnostic devices located in proximity to the processing region of a plasma reactor. Such diagnostic device preferably includes a deposition detecting device, such as a quartz crystal microbalance, an optical endpoint detector and an electrostatic probe, such as a Langiuir probe. The invention also provides microprocessor control of a plasma process using the information gathered from the optical and non-optical diagnostic devices. The invention further provides a plasma reactor that includes both optical and non-optical diagnostic devices positionable in proximity to the plasma.

The integrated diagnostic head assembly housing multiple sensors is preferably positionable within a single port defined in the process chamber wall to gather optical and non-optical data which is provided to a microprocessor for more accurate control of a plasma process. The integrated head assembly allows more information to be gathered about the progress of the plasma process, plasma characteristics as well as deposition build-up on the chamber walls and allows the microprocessor to impart increased control over the plasma-assisted process. In addition, the QCM allows quantification of deposition material on the interior chamber walls, thereby enabling determination of time intervals between cleaning processes for more effective particle contamination management and increased throughput. With the increasing feature densities and reduced feature widths of VLSI and ULSI, it is imperative that plasma processes and particle contamination be more precisely controlled. The present invention, therefore, preferably integrates both optical and non-optical diagnostic devices into a head assembly to exact control over plasma processes that could not otherwise be attained by either type of device alone, while also maintaining plasma integrity.

Figure 1:
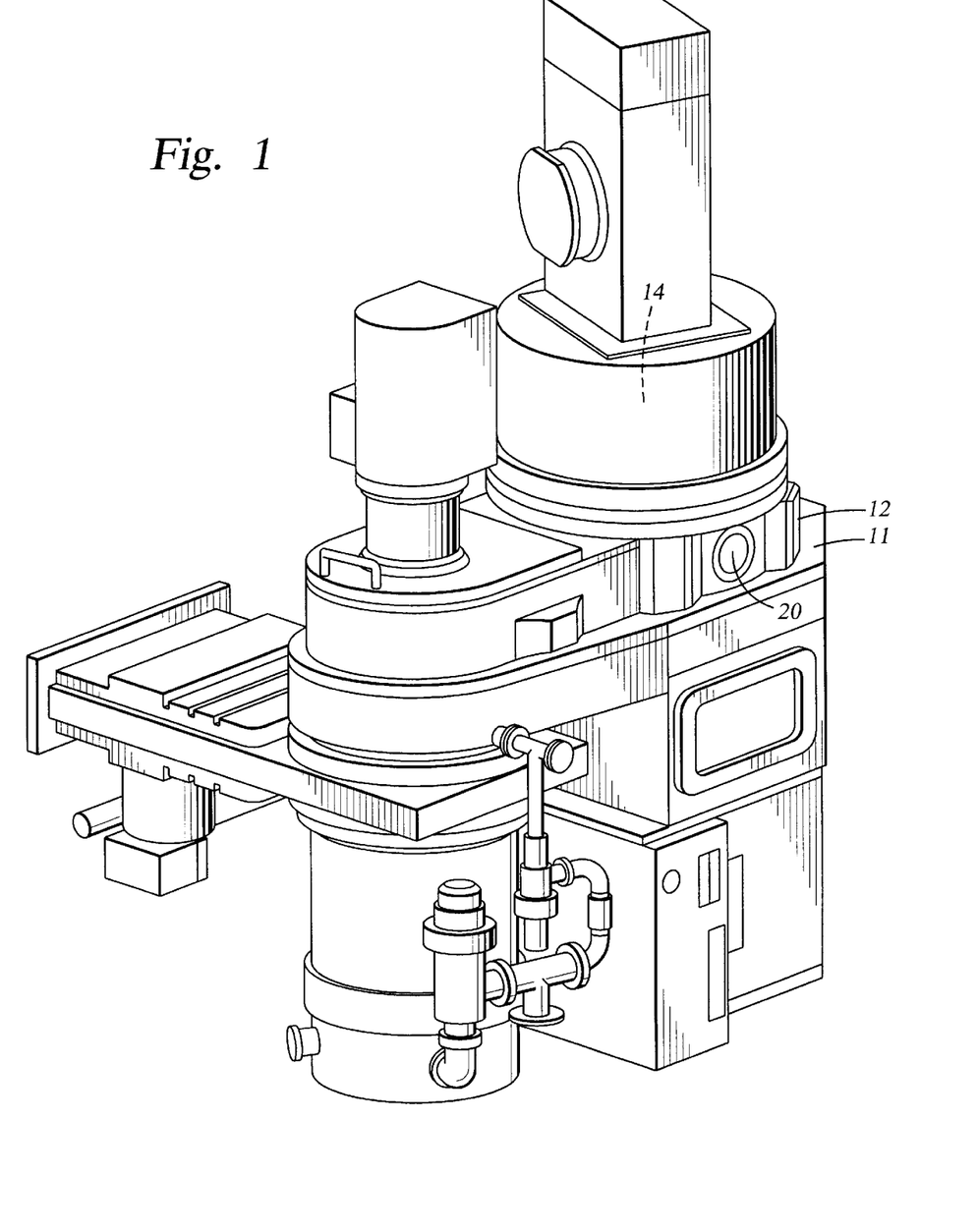
FIG. 1 is a substantially top schematic view of a high density plasma ("HDP") etch chamber.

Now referring to FIG. 1, a substantially top perspective view of a plasma etch chamber top 10 is shown. The chamber top 10 generally includes a base 11 and a chamber wall 12 which defines a plasma processing region 14. A gas distribution plate is typically supported on chamber wall 12 or around the base of the wall 12 to inlet reactive gases into plasma processing region 14. The chamber wall 12 is generally made of anodized aluminum and designed to preferably operate at vacuum pressures between about 0.001 torr and about 10 torr. The head assembly can also be used in a CVD chamber where the pressure may be in the range from about 1 millitorr to several hundred torr. In either instance, pressure is not determinative of the operation of the diagnostic head assembly or the chamber, but may be varied according to the process performed in the chamber. A detection port 20 is typically formed through the chamber wall 12 to provide diagnostic device access into the plasma processing region 14. The chamber also includes a substrate support member (not shown) on which a substrate is supported for processing.

A gas injection system of the plasma chamber delivers reactant gases over the substrate surface to enhance processing, and in some chamber designs may also serve as an electrode for striking a plasma in the region 14, i.e., between a gas distribution plate and a substrate. A direct current (DC) and/or radio frequency (RF) power source is applied to the electrode or a coil assembly to capacitively or inductively couple power into the plasma region 14 and excite the reactant gases into a plasma state. The operation of a high density plasma reactor is well-known in the art and for clarity of description will not be described in detail. The general operation of a plasma chamber is described by Cheng et al. in U.S. Pat. No. 4,842,683, entitled "Magnetic Field-Enhanced Plasma Etch Reactor," which is incorporated herein by reference.

Figure 2A:
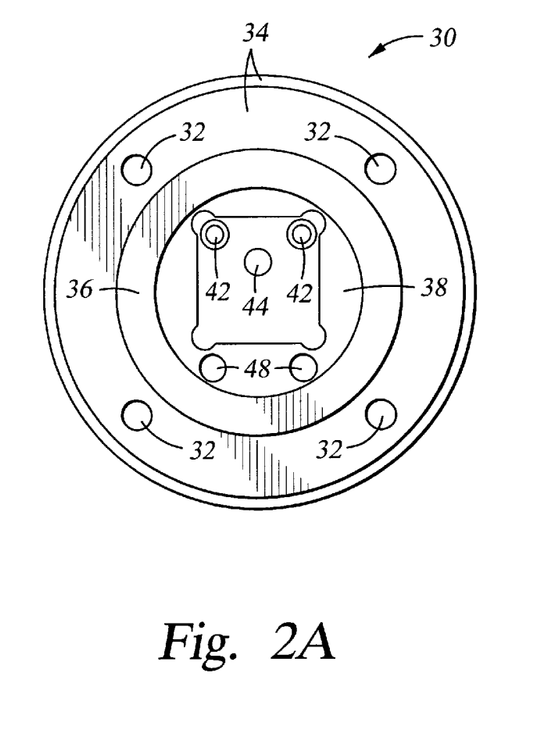
Figure 2B:
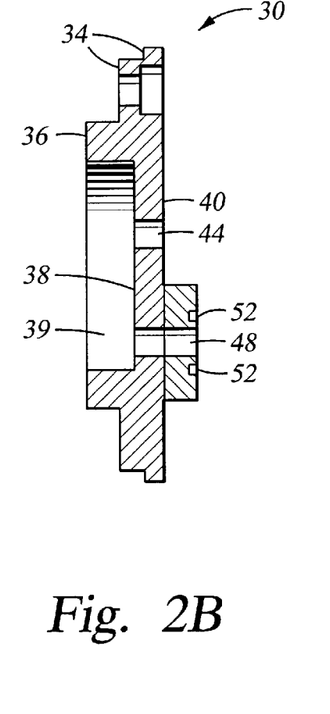
Figure 2C:
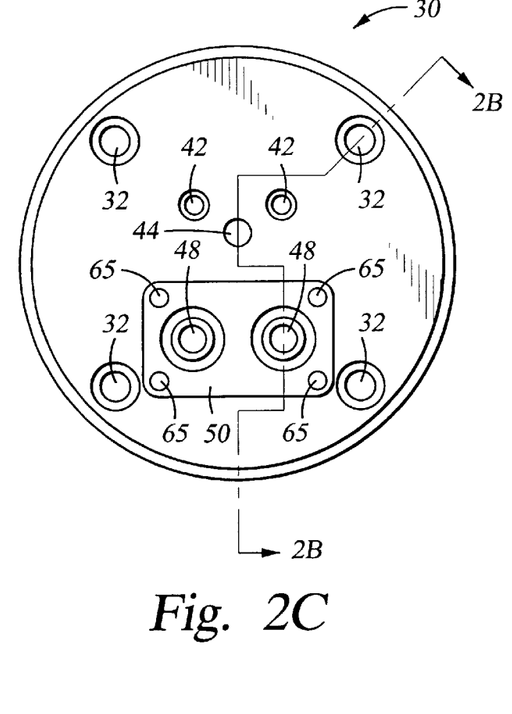

Now referring to FIGS. 2(a–c), front, side and back views of an integrated diagnostic head assembly 30 are shown. In FIG. 2(a), a front view (internal chamber face) of the head assembly 30 shows RF cable port 44, coolant line ports 42 and diagnostic access ports 48, extending through a base 38, and through which selected diagnostic devices access plasma processing region 14 and may be substantially shielded from the plasma by base 38 if necessary. A neck portion 36 extends from mounting base 38 to form a recess 39 which allows chamber gases to make more complete contact with the optical and non-optical sensors, thereby facilitating a more representative measurement of conditions within the chamber, without extending the sensors a significant distance into the chamber where the sensors could interfere with the plasma or other aspects of the process.

A stepped flange 34 on the outer perimeter of base 38 supports diagnostic head assembly 30 in port 20 and sealingly connects the head assembly 30 to the chamber wall 12. The interface defined between the walls of detection port 20 and the head assembly mounting flange 34 and neck 36 provides a vacuum tight seal to maintain vacuum integrity within the chamber. The surfaces of the detection port and head assembly that comprise the interface are generally machined surfaces and preferably include an o-ring groove and o-ring to maintain the vacuum seal therebetween. A plurality of bolt holes 32 are located around the perimeter edge of the mounting flange 34 to secure diagnostic head assembly 30 to chamber wall 12. The bolt holes, in cooperation with bolts 35 (see FIG. 4(a)), allow detachable coupling of the head assembly 30 to the chamber wall 12 surrounding the detection port 20 (see FIGS. 1 and 4(a)).

Figure 4:
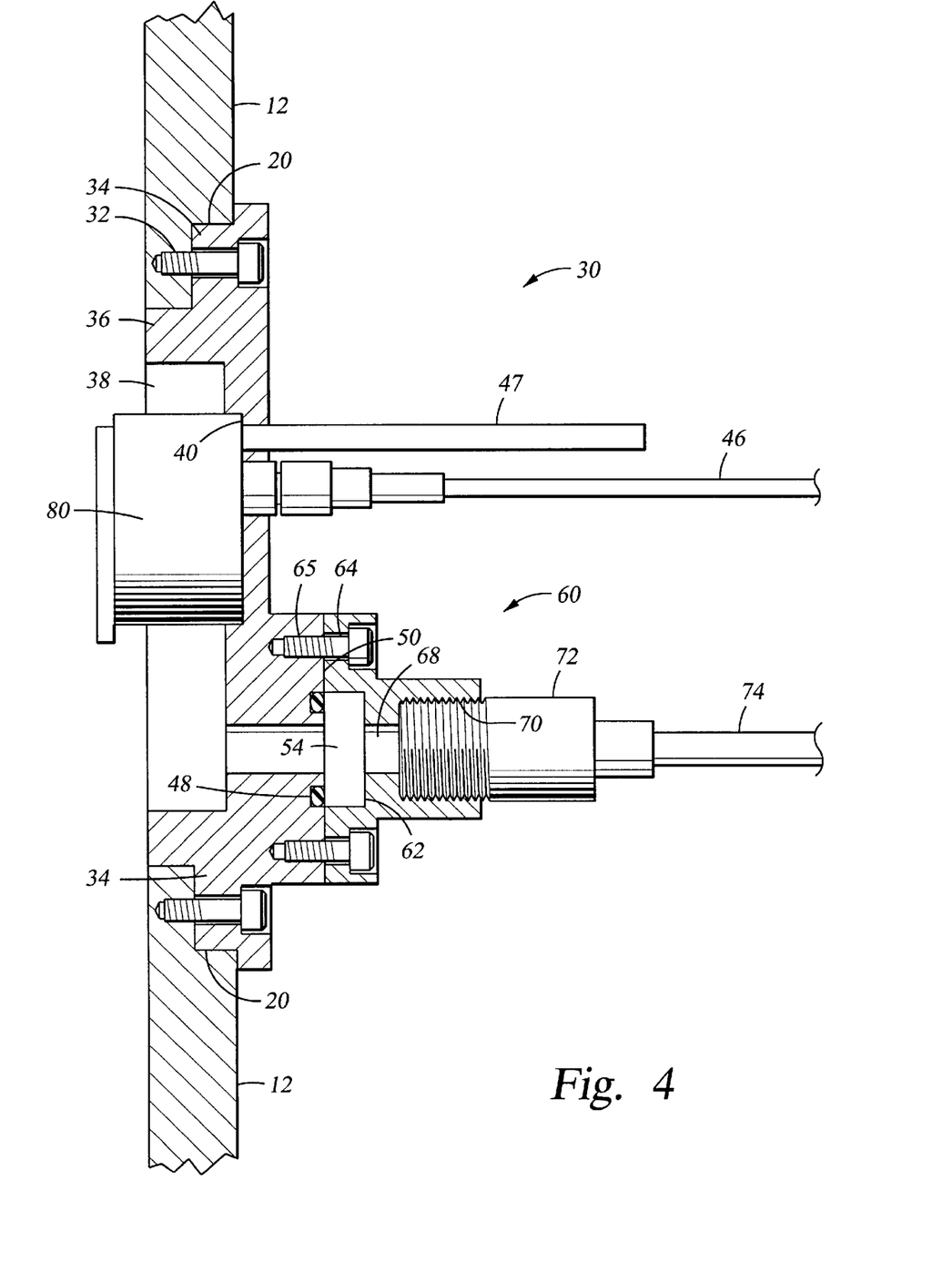
FIG. 4 is a cross-sectional view of a head assembly having a quartz crystal microbalance (QCM) and quartz window installed, wherein the head assembly is positioned within a detection port in a plasma etch chamber.

In one aspect of the present invention, the diagnostic head assembly 30 provides a mounting arrangement for a quartz crystal microbalance whose crystal portion is exposed to plasma region 14 and an optical endpoint detector disposed through one of the ports 48. The QCM is preferably vacuum expoxied to the vacuum side of head assembly 30 in recess 39 as shown in FIG. 4. An RF cable 46 extends through port 44 and coolant lines 47 extend through ports 42 to provide electrical connection to the QCM and to provide cooling fluids to the QCM, respectively. The QCM may also be welded or attached by various other means to the head 30 to secure the QCM in place on the diagnostic head assembly. The recess 39 is sized to preferably locate the quartz crystal of the QCM adjacent to the inner surface of the chamber wall. Positioning the crystal at this location is believed to provide more representative data detailing deposition of material on the chamber walls. Quantification of material deposits on the chamber wall enables more accurate determination of the time interval between chamber cleaning processes, thereby enabling increased throughput of a process system.

The base 38 provides ports 48 (shown in FIGS. 2(a–c) as two ports) extending through base 38 of the diagnostic head assembly 30 into the recessed area 39 in which a window platform 50 may be located. The surface of the platform 50 has a groove 52 formed around the port 48 for receiving an o-ring or other type seal and a quartz window 54 (see FIG. 4(a)). Preferably, an optical diagnostic device and an electrostatic probe are positioned on the diagnostic head assembly 30 through ports 48 to locate these devices in proximity to the plasma region 14, and provide line of sight access thereto. The optical sensor is preferably disposed behind a quartz window 54 and is used to detect visible changes in the plasma which indicate the endpoint of a selected plasma process, such as an etch process. The electrostatic probe preferably extends through the port 48 and into the recess 39 to provide direct communication with the plasma. The electrostatic probe is used to monitor the electrical characteristics of the plasma to enable increased control over the plasma process.

Figure 3A:
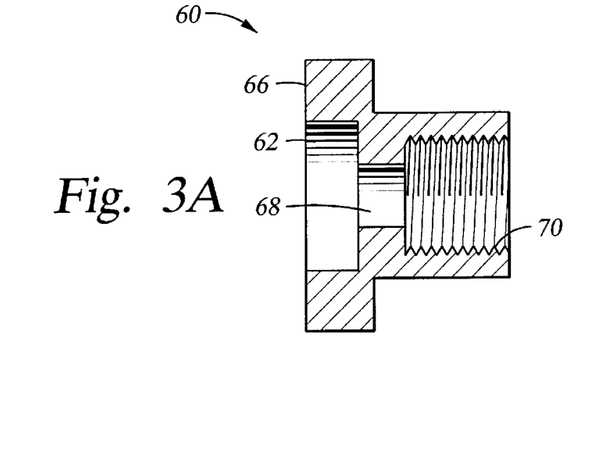
Figure 3B:
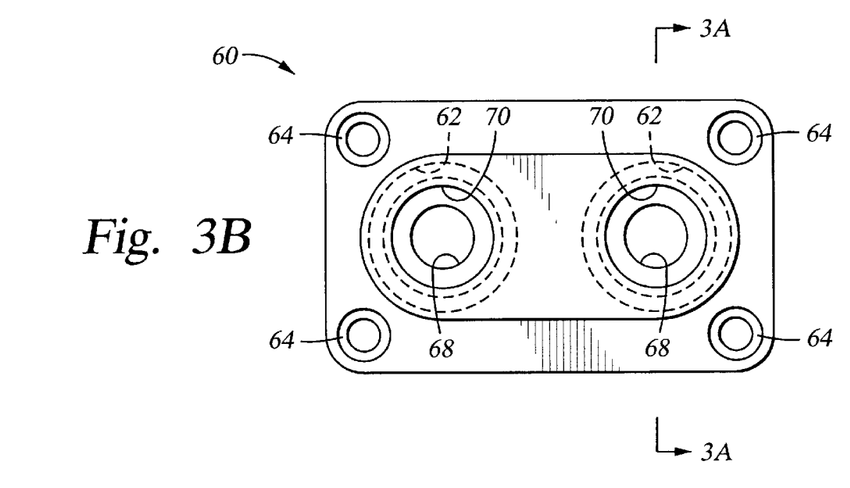

Now referring to FIGS. 3(a–b), side and back views of a window clamp 60 for use with the diagnostic head assembly of FIGS. 2(a)–2(c) are shown. The window clamp 60 has a recess 62 that receives the quartz window 54 and a plurality of bolt holes 64 that cooperate with the bolt holes 65 in the window platform. As the window clamp 60 is fastened to the window platform 50, the window is tightly pressed against an o-ring and the platform to form a vacuum tight seal. The clamp surface 66 is preferably coated with a sealing compound, or the like, to maintain the vacuum environment within the chamber.

The window clamp 60 also includes an open passage 68 that transmits light and other wavelengths of electromagnetic radiation through the quartz window. A sensor coupling 70 is provided just beyond the passage 68 for receiving a sensor 72, such as an optical sensor, having an electronic cable 74 to provide electrical data to a microprocessor controller.

Now referring to FIG. 4, a cross-sectional view of a diagnostic head assembly 30 is shown having a quartz crystal microbalance (QCM) 80, quartz window 54, window clamp 60, and optical sensor 72 installed thereon. The head assembly 30 is positioned within the detection port 20 formed in chamber wall 12. The head assembly of the present invention may be used to advantage in any process chamber, including the Applied Materials Precision 5000 M$_x$P magnetically-enhanced MERIE) polysilicon etch reactor.

Figure 5:
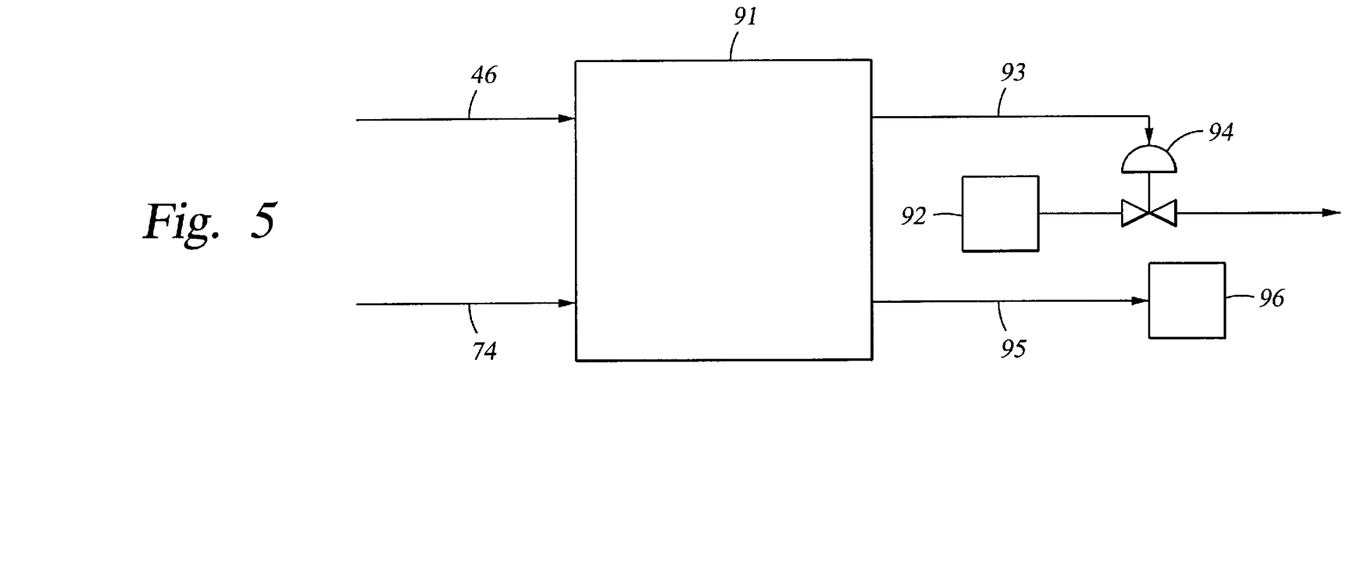
FIG. 5 is a schematic diagram of a control circuit.

Now referring to FIG. 5, a schematic diagram of a control circuit 90 is shown. A microprocessor controller 91 is provided in the control circuit 90 for receiving electronic signals from cables 46 of the QCM 80 and cable 74 of the optical sensor 72 (see FIG. 4(a)). These electronic signals 46,74 are processed by the controller 91 to selectively generate electronic signals 93,95 that control certain operations of the plasma chamber 10. In one aspect of the invention, the controller provides a signal 93 that controls the control valve 94 which supplies a reactant gas from source 92 to the chamber 10. In another aspect of the invention, the controller 91 provides a signal 95 that controls the power supply 96 to the chamber anode, thereby controlling plasma intensity.

While the foregoing is directed to the preferred embodiment of the present invention, other and further embodiments of the invention may be devised without departing from the basic scope thereof. The scope of the invention is determined by the claims which follow.

What is claimed is:

1. An apparatus for monitoring a plasma process and chamber wall deposition in a process chamber, wherein the apparatus is positionable within a detection port in a wall of the chamber, comprising:

a body member having a flange for coupling with a wall of the chamber, a first port and a second port;

a deposition monitor secured within the first port;

a quartz window secured within the second port; and an optical sensor disposed behind the quartz window.

2. The apparatus of claim 1, wherein the deposition monitor is a quartz crystal microbalance,.

3. The apparatus of claim 1, wherein the optical sensor is an endpoint detector.

4. The apparatus of claim 1, wherein the body member has a recessed area, and wherein the first and second ports are located within the recessed area.

5. The apparatus of claim 1, further comprising a window clamp for securing the quartz window within the second port, the window clamp having a coupling that secured the optical sensor thereto.

6. The apparatus of claim 1, further comprising a third port and a plasma monitoring probe secured within the third port.

7. The apparatus of claim 6, wherein the plasma monitoring probe is a Langmuir probe.

8. The apparatus of claim 1, further comprising a microprocessor controller, and wherein the deposition monitor and optical sensor generate electronic signals that are communicated to the microprocessor controller.

9. A control system for a plasma etch chamber having an enclosure wall, an electrode, a power source coupled to the electrode, a gas supply valve, and a detection port therein, comprising:

a body member positionable within the detection port and having a flange for coupling with the enclosure wall, the body member defining a first port and a second port;

a deposition monitor secured within the first port, the deposition monitor providing a first electronic signal indicating an amount of deposition thereon;

a quartz window secured within the second port;

an endpoint detector disposed behind the quartz window, the endpoint detector providing a second electronic signal indicating a composition change in the gas phase within the chamber; and a microprocessor controller receiving the first and second electronic signals, and providing electronic control signals to the gas supply valve and the power source.

10. The control system of claim 9, wherein the deposition monitor is a quartz crystal microbalance.

11. The control system of claim 9, wherein the microprocessor is programmed to send an electronic signal closing the gas supply valve upon detection of a composition change in the gas phase.

12. The control system of claim 9, wherein the microprocessor is programmed to send an electronic signal turning off the power supply upon detection of a composition change in the gas phase.

13. The control system of claim 9, wherein the microprocessor compares the first and second electronic signals to determine the endpoint of the etch process.

14. A plasma etch chamber, comprising:

an enclosure having a wall, a first electrode and a second electrode connected to a power source, a gas supply valve coupled to a gas source, and a detection port extending through the enclosure wall;

a head assembly secured within the detection port, the assembly having a first port securing a deposition monitor therein and a second port securing an endpoint detector therein, wherein the deposition monitor provides a first electronic signal indicating an amount of deposition thereon and the endpoint detector provides a second electronic signal indicating a composition change in the gas phase within the chamber; and a microprocessor controller receiving the first and second electronic signals, and providing electronic control signals to the gas supply valve and the power source.

15. The plasma etch chamber of claim 14, wherein the deposition monitor is a quartz crystal microbalance.

* * * * *

UNITED STATES PATENT AND TRADEMARK OFFICE
CERTIFICATE OF CORRECTION

PATENT NO : 5,885,402

DATED : March 23, 1999

INVENTOR(S) : Esquibel

It is certified that error appears in the above-identified patent and that said Letters Patent are hereby corrected as shown below:

In column 2, line 49, please replace "Langruir" with --Langmuir--.

In column 5, line 21, please replace "Lanqiuir" with --Langmuir--.

Signed and Sealed this

Sixteenth Day of November, 1999

*Attest:*

Q. TODD DICKINSON

*Attesting Officer*  *Acting Commissioner of Patents and Trademarks*